(12) United States Patent
Catabay et al.

(10) Patent No.: US 6,790,784 B2
(45) Date of Patent: Sep. 14, 2004

(54) PLASMA TREATMENT OF LOW DIELECTRIC CONSTANT DIELECTRIC MATERIAL TO FORM STRUCTURES USEFUL IN FORMATION OF METAL INTERCONNECTS AND/OR FILLED VIAS FOR INTERGRATED CIRCUIT STRUCTURE

(75) Inventors: Wilbur G. Catabay, Saratoga, CA (US); Wei-Jen Hsia, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/422,270

(22) Filed: Apr. 24, 2003

(65) Prior Publication Data

US 2003/0207594 A1 Nov. 6, 2003

Related U.S. Application Data

(62) Division of application No. 09/884,736, filed on Jun. 19, 2001.

(51) Int. Cl.[7] .............................................. H01L 21/302

(52) U.S. Cl. ....................................... 438/726; 438/714

(58) Field of Search ................................ 438/623, 634, 438/706, 723, 726, 725, 710, 714; 29/623.4, 825

(56) References Cited

U.S. PATENT DOCUMENTS

| | | | |
|---|---|---|---|
| 3,012,861 A | 12/1961 | Ling | 23/223.5 |
| 3,178,392 A | 4/1965 | Kriner | 260/46.5 |
| 3,652,331 A | 3/1972 | Yamazaki | 117/201 |

(List continued on next page.)

FOREIGN PATENT DOCUMENTS

| | | | |
|---|---|---|---|
| DE | 198 04 375 A1 | 7/1999 | ......... H01L/21/312 |
| EP | 0 706 216 A2 | 4/1996 | ......... H01L/23/532 |
| EP | 0 949 663 A2 | 10/1999 | ......... H01L/21/312 |
| JP | 63003437 | 1/1988 | ........... H01L/21/90 |
| JP | 2000-267128 | 9/2000 | ........... G02F/1/136 |
| WO | WO 99/41423 | 8/1999 | |

OTHER PUBLICATIONS

Bothra, S., et al., "Integration of 0.25 μm Three and Five Level Interconnect System for High Performance ASIC", *1997 Proceedings Fourteenth International VMIC Conference*, Santa Clara, CA, Jun. 10–12, 1997, pp. 43–48.

Dobson, C.D., et al., "Advanced $SiO_2$ Planarization Using Silane and $H_2O_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

(List continued on next page.)

*Primary Examiner*—Kamand Cuneo
*Assistant Examiner*—Lisa Kilday
(74) *Attorney, Agent, or Firm*—John P. Taylor (57) ABSTRACT

A process for forming an integrated circuit structure comprises forming a layer of low k dielectric material over a previously formed integrated circuit structure, and treating the upper surface of the layer of low k dielectric material with a plasma to form a layer of densified dielectric material over the remainder of the underlying layer of low k dielectric material, forming a second layer of low k dielectric material over the layer of densified dielectric material, and treating this second layer of low k dielectric material to form a second layer of densified dielectric material over the second layer of low k dielectric material. The layer or layers of densified dielectric material formed from the low k dielectric material provide mechanical support and can then function as etch stop and mask layers for the formation of vias and/or trenches.

13 Claims, 5 Drawing Sheets

U.S. PATENT DOCUMENTS

| | | | |
|---|---|---|---|
| 3,832,202 A | 8/1974 | Ritchie | 106/287 |
| 3,920,865 A | 11/1975 | Läufer et al. | 427/220 |
| 4,705,725 A | 11/1987 | Glajch et al. | 428/405 |
| 4,771,328 A | 9/1988 | Malaviya et al. | 357/49 |
| 5,171,945 A * | 12/1992 | Su | 200/6 R |
| 5,194,333 A | 3/1993 | Ohnaka et al. | 428/405 |
| 5,314,845 A | 5/1994 | Lee et al. | 437/238 |
| 5,364,800 A | 11/1994 | Joyner | 437/28 |
| 5,376,595 A | 12/1994 | Zupancic et al. | 501/12 |
| 5,470,801 A | 11/1995 | Kapoor et al. | 437/238 |
| 5,558,718 A | 9/1996 | Leung | 118/723 E |
| 5,559,367 A | 9/1996 | Cohen et al. | 257/77 |
| 5,580,429 A | 12/1996 | Chan et al. | 204/192.38 |
| 5,628,871 A | 5/1997 | Shinagawa | 438/514 |
| 5,675,187 A | 10/1997 | Numata et al. | 257/758 |
| 5,688,724 A | 11/1997 | Yoon et al. | 437/235 |
| 5,712,208 A * | 1/1998 | Tseng et al. | 438/770 |
| 5,858,879 A | 1/1999 | Chao et al. | 438/725 |
| 5,864,172 A | 1/1999 | Kapoor et al. | 257/634 |
| 5,874,367 A | 2/1999 | Dobson | 438/787 |
| 5,874,745 A | 2/1999 | Kuo | 257/59 |
| 5,882,489 A | 3/1999 | Bersin et al. | 204/192.35 |
| 5,904,154 A | 5/1999 | Chien et al. | 134/1.2 |
| 5,915,203 A | 6/1999 | Sengupta et al. | 438/669 |
| 5,930,655 A | 7/1999 | Cooney, III et al. | |
| 5,939,763 A | 8/1999 | Hao et al. | 257/411 |
| 5,989,998 A | 11/1999 | Sugahara et al. | |
| 6,025,263 A | 2/2000 | Tsai et al. | 438/624 |
| 6,028,015 A | 2/2000 | Wang et al. | 438/789 |
| 6,037,248 A | 3/2000 | Ahn | 438/619 |
| 6,043,145 A | 3/2000 | Suzuki et al. | |
| 6,043,167 A | 3/2000 | Lee et al. | 438/789 |
| 6,051,073 A | 4/2000 | Chu et al. | 118/723 |
| 6,051,477 A | 4/2000 | Nam | 438/404 |
| 6,054,379 A | 4/2000 | Yau et al. | 438/623 |
| 6,063,702 A | 5/2000 | Chung | |
| 6,066,574 A | 5/2000 | You et al. | 438/781 |
| 6,100,184 A * | 8/2000 | Zhao et al. | 438/638 |
| 6,114,259 A | 9/2000 | Sukharev et al. | 438/789 |
| 6,147,012 A | 11/2000 | Sukharev et al. | 438/787 |
| 6,153,524 A | 11/2000 | Henley et al. | 438/691 |
| 6,204,192 B1 | 3/2001 | Zhao et al. | 438/723 |
| 6,215,087 B1 | 4/2001 | Akahori et al. | |
| 6,232,658 B1 | 5/2001 | Catabay et al. | 257/701 |
| 6,245,690 B1 | 6/2001 | Yau et al. | 438/780 |
| 6,627,532 B1 * | 9/2003 | Gaillard et al. | 438/623 |
| 6,635,575 B1 * | 10/2003 | Xia et al. | 438/697 |

OTHER PUBLICATIONS

Koda, Seiichiro, et al., "A Study of Inhibition Effects for Silane Combustion by Additive Gases", *Combustion and Flame*, vol. 73, No. 2, Aug., 1988, pp. 187–194.

Peters, Laura, "Low–k Dielectrics: Will Spin–On or CVD Prevail?", *Semiconductor International*, vol. 23, No. 6, Jun., 2000, pp. 108–110, 114, 116, 118, 122, and 124.

Peters, Laura, "Pursuing the Perfect Low-k Dielectric", *Semicondutor International*, vol. 21, No. 10, Sep., 1998, pp. 64–66, 68, 70, 72, and 74.

Sugahara, Satoshi, et al., "Chemical Vapor Deposition of $CF_3$–Incorporated Silica Films for Interlayer Dielectric Application", 1999 Joint International Meeting, *Electrochemical Society Meeting Abstracts*, vol. 99–2, 1999, Abstract No. 746.

\* cited by examiner

PLASMA TREATMENT OF LOW DIELECTRIC CONSTANT DIELECTRIC MATERIAL TO FORM STRUCTURES USEFUL IN FORMATION OF METAL INTERCONNECTS AND/OR FILLED VIAS FOR INTERGRATED CIRCUIT STRUCTURE

CROSS REFERENCE TO RELATED APPLICATIONS

This application is a division of U.S. patent application Ser. No. 09/884,736 filed Jun. 19, 2001.

The subject matter of this application relates to the subject matter of U.S. Pat. No. 6,350,700, issued Feb. 26, 2002, entitled "PROCESS FOR FORMING TRENCHES AND VIAS IN LAYERS OF LOW DIELECTRIC CONSTANT CARBON-DOPED SILICON OXIDE DIELECTRIC MATERIAL OF AN INTEGRATED CIRCUIT STRUCTURE WHILE INHIBITING DAMAGE TO THE LAYERS OF LOW DIELECTRIC CONSTANT CARBON-DOPED SILICON OXIDE DIELECTRIC MATERIAL", assigned to the assignee of this application, and the subject matter of which is hereby incorporated herein by reference.

The subject matter of this application relates to the subject matter of U.S. Pat. No. 6,368,979, issued Apr. 9, 2002, entitled "PROCESS FOR FORMING TRENCHES AND VIAS IN LAYERS OF LOW DIELECTRIC CONSTANT CARBON-DOPED SILICON OXIDE DIELECTRIC MATERIAL OF AN INTEGRATED CIRCUIT STRUCTURE", assigned to the assignee of this application, and the subject matter of which is hereby incorporated herein by reference.

BACKGROUND OF THE INVENTION

1. Field of the Invention

This invention relates to the formation of integrated circuit structures having one or more layers of low dielectric constant (low k) dielectric material. More particularly, this invention relates to a process for plasma treating a layer of low k dielectric material to form, in the surface of the low k dielectric material, a structure useful as an etch stop and/or an etch mask in subsequent formation of a layer of metal interconnects and/or filled vias.

2. Description of the Related Art

The shrinking of integrated circuits has resulted in levels of electrically conductive interconnects being placed closer together vertically, as well as reduction of the horizontal spacing between the electrically conductive interconnects, such as metal lines, on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric constant to thereby lower the capacitance.

In an article by L. Peters, entitled "Pursuing the Perfect Low-K Dielectric", published in Semiconductor International, Volume 21, No. 10, Sep. 1998, at pages 64–74, a number of alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U.K. The process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture.

An article by S. McClatchie et al. entitled "Low Dielectric Constant Oxide Films Deposited Using CVD Techniques", published in the 1998 Proceedings of the Fourth International Dielectrics For ULSI Multilevel Interconnection Conference (Dumic) held on Feb. 16–17, 1998 at Santa Clara, Calif., at pages 311–318, also describes the formation of methyl-doped silicon oxide by the low-k Flowfill process of reacting methyl silane with $H_2O_2$ to achieve a dielectric constant of ~2.9.

The incorporation of such carbon-doped silicon oxide dielectric material into interconnect architecture has been very attractive not only because of the low k properties, but also because of the compatibility with conventional silicon process technologies. Generally these materials remain stable upon annealing at temperatures of up to 500° C. The carbon doped silicon oxide materials are characterized by the structure of amorphous silicon oxide with incorporated methyl groups and hydrogen species, and are also characterized by a reduced density in comparison with conventional silicon oxide that can be explained by the formation of microporosity surrounding the incorporated methyl groups. Furthermore, such hydrocarbon-modified silicon oxide dielectric materials deposited by CVD techniques are also characterized by strong adhesion.

The above-mentioned shrinking of integrated circuits and resultant increase in capacitance and loss in speed has also resulted in a renewed interest in the utilization of higher conductivity materials such as copper for the metal interconnects or "wiring" used in the integrated circuit structure. However, one problem with the use of copper to replace other conductive metals such as aluminum or tungsten in the formation of metal interconnect layers is the difficulty encountered with attempts to apply to the use of copper the conventional process techniques used in forming aluminum or tungsten interconnects wherein a previously deposited layer of metal is patterned by etching the metal layer through a photoresist etch mask photolithographically formed over the metal layer.

Because of these processing difficulties which have confronted attempts to conventionally form copper metal interconnects by patterning a previously deposited layer of copper metal, a different process, referred to as a damascene process, has been developed for forming copper metal interconnects. Instead of forming the metal interconnects first, and then filling the spaces in between the metal interconnects with dielectric material, a dielectric layer is first blanket deposited over the underlying integrated circuit structure, and a pattern of trenches having geometry conforming to the desired pattern of copper metal interconnects is formed through the dielectric layer. After optional formation of thin layers of electrically conductive material over the dielectric layer (and over the surfaces of the trenches therein) to respectively serve as a barrier layer between the dielectric material and the copper, and to facilitate adhesion of the copper layer to the dielectric material, a layer of copper metal is blanket deposited over the dielectric layer. This copper layer fills up all the trenches, as well as depositing on the upper surface of the dielectric layer. The excess copper (and excess barrier/adhesion layers if present) is then removed from the surface of the dielectric material, e.g., by a CMP process, leaving the desired pattern of copper metal interconnects in the trenches in the dielectric layer.

Advantageously, such a process for forming copper metal interconnects is combined with a process for forming copper-filled vias by using a stack of two dielectric layers, with via openings formed in the lower dielectric layer and trench openings formed in the upper dielectric layer. Both the vias and the trenches are then filled with copper during a single copper deposition step. In this process, commonly referred to as a dual damascene process, excess copper is again removed from the surface of the upper layer of dielectric material, usually by a CMP process, leaving a pattern of copper metal interconnects vertically connected electrically by copper-filled vias to the underlying integrated circuit structure.

While the just described damascene and dual damascene processes permit the use of highly electrically conductive copper metal for both via filling and metal interconnect formation, integrated of such processes with the use of layers of low k dielectric materials has resulted in the formation of further problems. The damascene processes, and in particular the dual damascene process, require the use of masking and etch stop layers which may necessitate the use of layers of non-low k dielectric layers between and over the layers of low k dielectric material, thereby undesirably raising the overall dielectric constant of the resultant compound layer of dielectric materials. Furthermore, to ensure selectivity of the mask or etch stops materials during the etch step or steps, it has, in the past, been necessary to use different dielectric material such as silicon nitride or silicon carbide for the mask and/or etch stop layers. This further complicates the deposition portion of the process, since the semiconductor substrate on which the integrated circuit structure is formed may have to be moved back and forth between several deposition chambers. Adhesion problems between dielectric layers may also arise when layers of materials such as silicon nitride and silicon carbide are introduced into the structure.

It would, therefore, be desirable to form an integrated circuit structure with both low k dielectric material and copper metal interconnects and/or copper-filled vias wherein any permanent introduction of other material such as silicon nitride or silicon carbide as masks or etch stops is avoided, and increases in the dielectric constant of the resultant compound layer of dielectric materials is minimized, thereby optimizing the benefits of the combined use of low k dielectric materials and copper-filled vias and/or copper metal interconnects.

SUMMARY OF THE INVENTION

The invention comprises a process for forming an integrated circuit structure having at least one layer of low k material thereon, and another dielectric layer over the layer of low k dielectric material, formed from the same low k dielectric layer, and suitable for use as an etch stop and/or an etch mask. The process comprises forming a layer of low k dielectric material over a previously formed integrated circuit structure, and treating the upper surface of the layer of low k dielectric material with a plasma to form a layer of densified dielectric material over the remainder of the underlying layer of low k dielectric material, whereby the layer of densified dielectric material is capable of serving as a etch stop and/or an etch mask for etching of the underlying layer of low k dielectric material. The densification also provides mechanical support by improving the mechanical strength of the low k film stack.

In a preferred embodiment, a second layer of low k dielectric material is then deposited over the layer of densified dielectric material and this second layer of low k dielectric material is then also treated to form a second layer of densified dielectric material over the second layer of low k dielectric material. The layer or layers of densified dielectric material formed from the low k dielectric material can then function as etch stop and mask layers for the formation of vias and/or trenches in the layer or layers of low k dielectric material without the need to add permanent layers of other materials such as silicon nitride or silicon carbide to the structure, thus resulting in an overall lowering of the resultant dielectric constant of the compound layers of dielectric material, as well as improving the adhesive characteristics of the resulting composite of dielectric layers, and consequent reduction or elimination of delamination problems without, however, encountering damage to the low k dielectric material during such processing.

DETAILED DESCRIPTION OF THE INVENTION

The invention comprises a process for forming an integrated circuit structure having at least one layer of low k material thereon, and another dielectric layer over the layer of low k dielectric material, formed from the same low k dielectric layer, and suitable for use as an etch stop and/or an etch mask. The process comprises forming a layer of low k dielectric material over a previously formed integrated circuit structure, and treating the upper surface of the layer of low k dielectric material with a plasma to form a layer of densified dielectric material over the remainder of the underlying layer of low k dielectric material, whereby the layer of densified dielectric material is capable of serving as a etch stop and/or an etch mask for etching of the underlying layer of low k dielectric material. In a preferred embodiment, a second layer of low k dielectric material is then deposited over the layer of densified dielectric material and this second layer of low k dielectric material is then also treated to form a second layer of densified dielectric material over the second layer of low k dielectric material. The layer or layers of densified dielectric material formed from the low k dielectric material provide mechanical support and can then function as etch stop and mask layers for the formation of vias and/or trenches in the layer or layers of low k dielectric material without the need to add permanent layers of other materials such as silicon nitride or silicon carbide to the structure, thus resulting in an overall lowering of the resultant dielectric constant of the compound layers of dielectric material, as well as improving the adhesive characteristics of the resulting composite of dielectric layers, and consequent reduction or elimination of delamination problems without, however, encountering damage to the low k dielectric material during such processing.

The term "low k", as used herein, is intended to define a dielectric constant of a dielectric material of 3.5 or less. Preferably, the dielectric constant of a "low k" material will be 3.0 or less, and most preferably will be 2.5 or less.

The layers of low k dielectric material described herein may comprise carbon-doped silicon oxide dielectric material or any other type of low k dielectric material capable of being treated in a plasma to form, from the surface portion of the low k dielectric layer, a densified layer of dielectric material having characteristics resembling a conventional (non-low k) silicon oxide or silicon carbide dielectric material. Low k dielectric material suitable for use in this invention and capable of being treated to form the desired layer or layers of densified dielectric material can be formed using processes and equipment commercially available from, for example, Novellus, AMAT, Trikon, ASM, Dow Corning, Hitachi, Dow Chemical, Honeywell, Schumacher, and W. L. Gore. Other low k dielectric materials which may be used in the process of the invention include the low k dielectric materials described in U.S. Pat. No. 6,303,047, issued Oct. 16, 2001; U.S. Pat. No. 6,365,528, issued Apr. 2, 2002; U.S. Pat. No. 6,572,925, issued Jun. 3, 2003 ; and U.S. Pat. No. 6,649,219, issued Nov. 18. 2003; and U.S. patent application Ser. No. 09/792,685; all of which patents and applications are assigned to the assignee of the invention; and the subject matter of each of which is hereby incorporated by reference. The formation of densified dielectric material on the surface of a low k dielectric material is also disclosed in Sukharev et al. U.S. Pat. No. 6,114,259, issued Sep. 5, 2000 and assigned to the assignee of this application, and the subject matter of which is hereby incorporated herein by reference.

The densification step used to treat the surface of the layer of low k dielectric material to form the layer of densified dielectric material comprises exposing the surface of a previously formed layer of low k dielectric material to a plasma formed from a neutral or reducing gas such as, for example, $H_2$, He, Ar, $NH_3$, or $N_2$. The reaction parameters used during the densification process may vary with the gas used in the plasma, as well as the materials present during the densification process. For example, when hydrogen gas is used, the power level should be maintained within a range of from about 500 to about 1500 watts, preferably from about 800 to about 12 00 watts, and most preferably from about 900 to about 100 watts, with the typical power level being about 1000 watts. The plasma power source may be a single frequency power source, e.g., a conventional 13.56 MHz source, or such a source may be used in conjunction with a low frequency power source, such as a 600–800 Hz power supply, with one or the other of the power supplies usually coupled to the substrate support on which integrated circuit structure being treated is mounted.

The pressure in the reactor where the plasma densification treatment is being carried out should range from about 1 Torr to about 10 Torr, preferably from about 1 to about 5 Torr, and most preferably from about 2 to about 4 Torr, with the typical pressure being maintained at about 2–3 Torr. The temperature of the densification treatment should be at least high enough to achieve the desired results efficiently without exceeding a temperature at which the low k dielectric material being treated might be damaged or destroyed. Furthermore, when copper is present, the maximum temperature should be below that temperature at which the copper would be degraded or diffuse into undesired regions of the integrated circuit structure. The temperature of the densification treatment will range from about 200° C. to about 500° C., with a temperature range of from about 350° C. to about 450° C. preferred.

The time of the densification treatment will vary with the desired thickness of the layer of densified dielectric material. Such thickness will, in turn, depend upon the desired use of the layer of densified dielectric material. When the layer of densified dielectric material, for example, is to serve as an etch stop layer, it can be thinner than when it will be used as a hard wherein some of the initial thickness of the layer will be eroded away as the etch proceeds. Typically, when an etch stop layer is to be formed, the densification treatment will be carried out for from about 30 seconds to about 10 minutes, preferably from about 2 minutes to about 5 minutes, and typically about 3 minutes to form an etch stop layer of densified dielectric material having a thickness ranging from about 300 Å to about 1000 Å, and preferably from about 400 Å to about 600 Å, with a typical thickness being about 500 Å. Thicker layers may be need when the layer of densified dielectric material is to function as an etch mask, with the thickness of the mask layer ultimately dependent upon the thickness of the material being etched below the etch mask.

Figure 1:
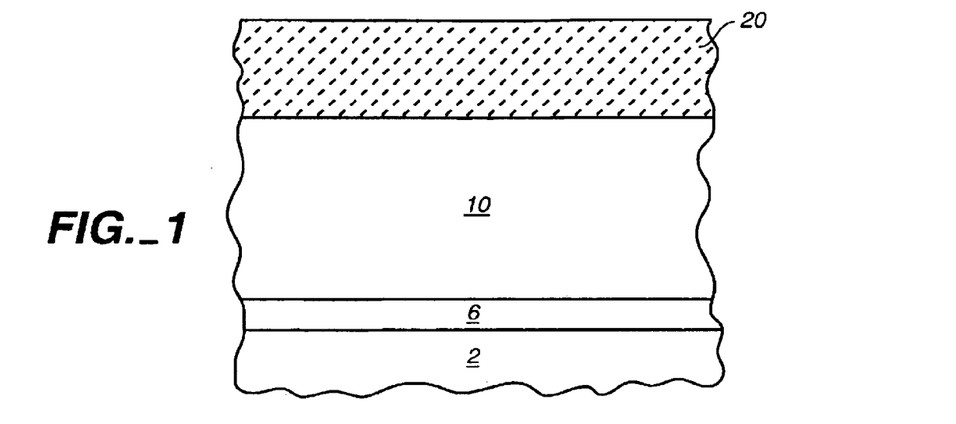
FIG. 1 is a fragmentary vertical cross-sectional view of a layer of low k dielectric material formed over an integrated circuit structure, with a layer of densified dielectric material shown formed over the layer of low k dielectric material.

Turning now to FIG. 1, an integrated circuit structure is shown at 2 having a barrier layer 6 formed thereon to isolate the materials in integrated circuit structure 2 from layer 10 of low k dielectric material formed over barrier layer 6. Layer 20 of densified dielectric material, formed by subjecting the upper surface of low k layer 10 to the plasma densification treatment just described, is shown formed over the top surface of low k layer 10.

By way of examples, integrated circuit structure 2 may comprise a lower level of previously formed metal interconnects, a lower level of dielectric material having filled vias or contact openings therein, or it may comprise contact portions of active or passive electronic devices.

Barrier layer 6, formed over integrated circuit structure 2, may comprise a conventional silicon oxide dielectric material or another conventional dielectric material such as silicon nitride, silicon oxynitride, or silicon carbide. From at least the standpoint of adhesion to other layers, it is preferable that barrier layer 6 comprise silicon oxide.

The purpose of barrier layer 6 is to chemically isolate low k dielectric layer 10 from other portions of integrated circuit structure 2. Since the dielectric material comprising barrier layer 6 will have a higher dielectric constant (k) than low k dielectric layer 10 (~4 for silicon oxide and higher for the other above-mentioned dielectric materials), it is important that barrier layer 6 have a thickness no greater than necessary to achieve the desired chemical isolation from integrated circuit structure 2. Typically the thickness of barrier layer 6 will range from about 250 Å to about 500 Å.

Figure 2:
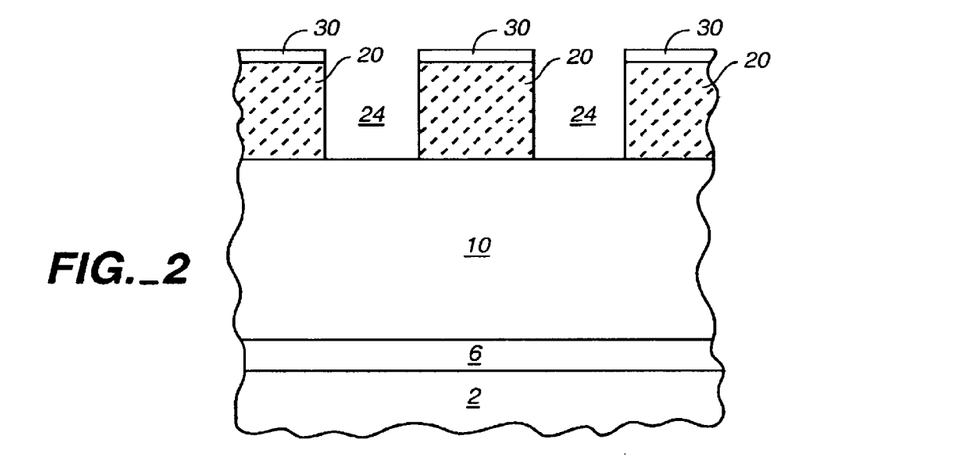
FIG. 2 is a fragmentary vertical cross-sectional view of the structure of FIG. 1, with a photoresist mask formed over the layer of densified dielectric material and openings etched in the layer of densified dielectric material through the resist mask to thereby replicate, in the layer of densified material, the openings in the resist mask.

FIG. 2 shows the structure of FIG. 1 with a resist mask 30 formed over densified dielectric layer 20 and openings 24 selectively etched in layer 20 through resist mask 30. Densified dielectric layer 20 may be etched using fluorocarbon/hydrofluorocarbon etchants comprising, for example, a mixture of $CF_4$, $CH_2F_2$, argon, and oxygen. The pressure during the process, regardless of which material is being etched, should be maintained within a range of from about 50 millitorr to about 500 millitorr, and preferably within a range of from about 100 millitorr to about 200 millitorr.

It should be noted that both densified dielectric layer 20 and low k dielectric layer 10 could be etched through resist mask 30 to form openings 24 in densified layer 20 and openings 14 in low k layer 10. However, the reason for selectively removing only densified layer 20 using resist mask 30 is to replicate in densified layer 20 the pattern of openings in resist mask 30 so that the removal of resist mask 30 using, for example, an ashing process will not result in exposure of the low k dielectric material to the ashing process which could damage the low k material. Therefore, a selective etch is used to first etch only the densified layer 20 through resist mask 30, then resist mask 30 is removed, and then low k layer 10 is etched through openings 24 in densified layer 20, using, for example, etch chemistry comprising $CF_4$, Ar, CO, and $N_2$. For this reason, the initial etching of densified layer 20 through resist mask 30 should preferably be carried out for a period of time insufficient to remove all of the densified material in openings 24, rather than the converse to assure non-exposure of the underlying low k dielectric material in low k layer 10 to the ashing process.

Figure 3:
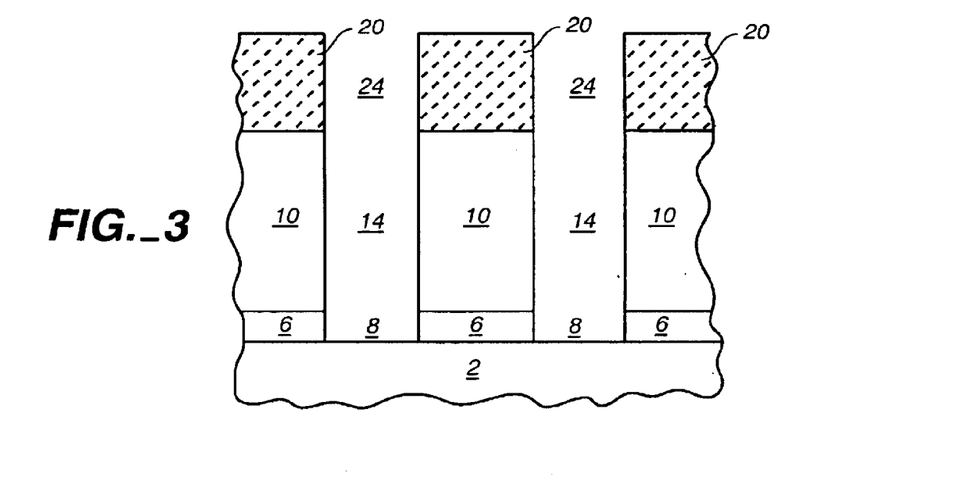
FIG. 3 is a fragmentary vertical cross-sectional view of the structure of FIG. 2, with the photoresist mask removed, and openings etched in the layer of low k dielectric material through the openings in the layer of densified dielectric material which now serves as a hard etch mask.

Turning now to FIG. 3, after removal of resist mask 30, the fluorocarbon/hydrofluorocarbon etch is resumed to etch away any remaining portions of densified layer 20 at the bottom of holes 24 and then to etch holes 14 through low k layer 10 and holes 8 in barrier layer 6 to thereby form a via or contact opening down to underlying integrated circuit structure 2, as shown in FIG. 3. Since densified layer 20 is formed from low k dielectric layer 10, there should be no problem of adhesion between low k layer 10 and the densified layer 20. Furthermore, when silicon-based material is used to form barrier layer 6 and low k dielectric layer 10 comprises a silicon oxide-based dielectric material, adhesion problems between barrier layer 6 and low k layer 10 should be minimized as well, thus effectively eliminating adhesion problems between the individual layers making up the compound dielectric layer. Furthermore, the formation of densified layer 20 from low k layer 10 permits a single chamber to be used for the formation of the low k dielectric layer 10 and its subsequent plasma densification treatment to form densified layer 20, thus eliminating time consuming and potentially contaminating movements of the substrate between multiple processing chambers.

Figure 4:
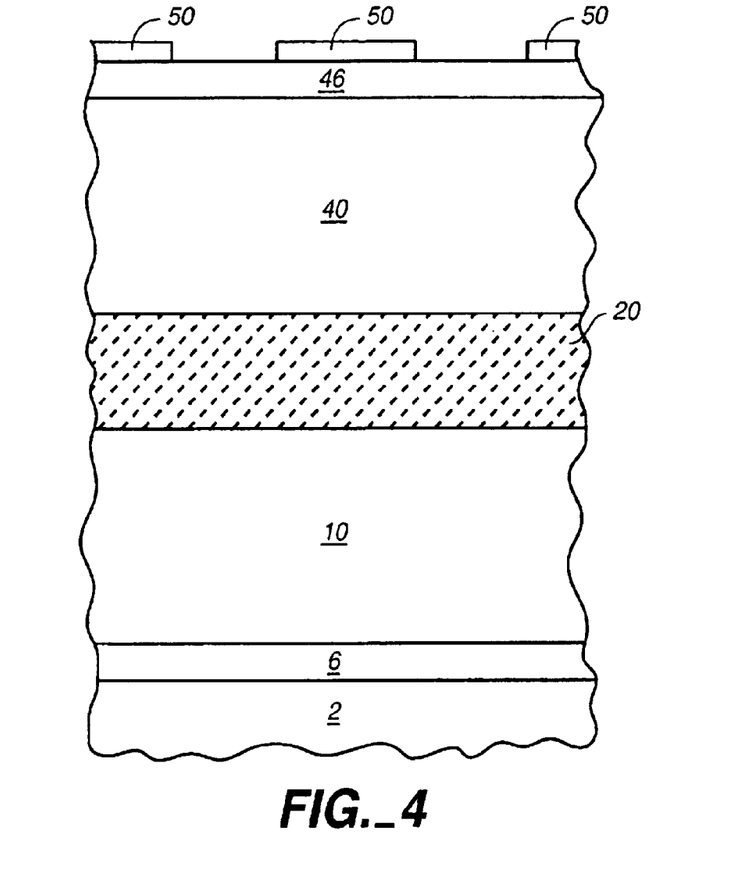
FIG. 4 is a fragmentary vertical cross-sectional view of the structure of FIG. 1, with a second layer of low k dielectric material deposited over the layer of densified dielectric material, a protective capping layer of silicon oxide shown formed over the second layer of low k dielectric material, and a photoresist mask formed over the capping layer of silicon oxide.

Turning now to FIG. 4, another embodiment of the invention is shown wherein, after densification treatment of low k dielectric layer 10 has been carried out to form densification dielectric layer 20, a second layer of low k dielectric material 40 is formed over first densification layer 20. Preferably, to mitigate adhesion problems, low k dielectric layer 40 comprises the same dielectric material used in forming first low k dielectric layer 10, although any of the previously discussed low k dielectric materials could be used for dielectric layer 40.

At this point, as also shown in FIG. 4, a capping layer 46, comprising, for example, conventional silicon oxide as used for dielectric barrier layer 6, could be deposited over low k dielectric layer 40 as a protective layer followed by deposition of resist mask 50 over protective capping layer 46. Capping layer 46 may then be selectively etched through resist mask 50 to form a hard mask in capping layer 46, followed by removal of resist mask 50 before the etching of second low k dielectric layer 40, thereby protecting low k layer 40 from the processing used to remove resist mask 50, as in the previous embodiment. This selective etching of protective capping layer 46 can also be carried out, when capping layer 46 comprises silicon oxide or silicon carbide, using the previously described fluorocarbon/hydrofluorocarbon etch to etch away substantially all of the exposed capping layer 46 beneath resist mask 50.

Figure 5:
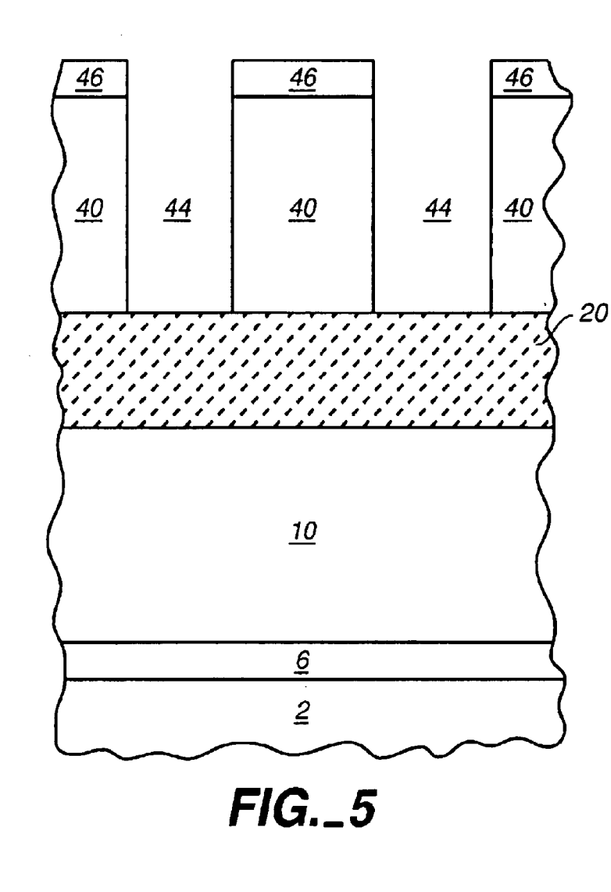
FIG. 5 is a fragmentary vertical cross-sectional view of the structure of FIG. 4, with openings etched in the capping layer of silicon oxide through the resist mask, the resist mask then removed, and openings etched in the second layer of low k dielectric material through the openings previously etched in the capping layer, with the first layer of densified dielectric material acting as an etch stop.

Resist mask 50 is then conventionally removed, e.g., by an ashing treatment, followed by resumption of the fluorocarbon etch to etch away the exposed portion of second low k dielectric layer 40, with the etch stopping at first densified dielectric layer 20 which now functions as an etch stop layer, resulting in the structure shown in FIG. 5 with openings 44, such as via openings, formed in second dielectric layer 40.

Figure 6:
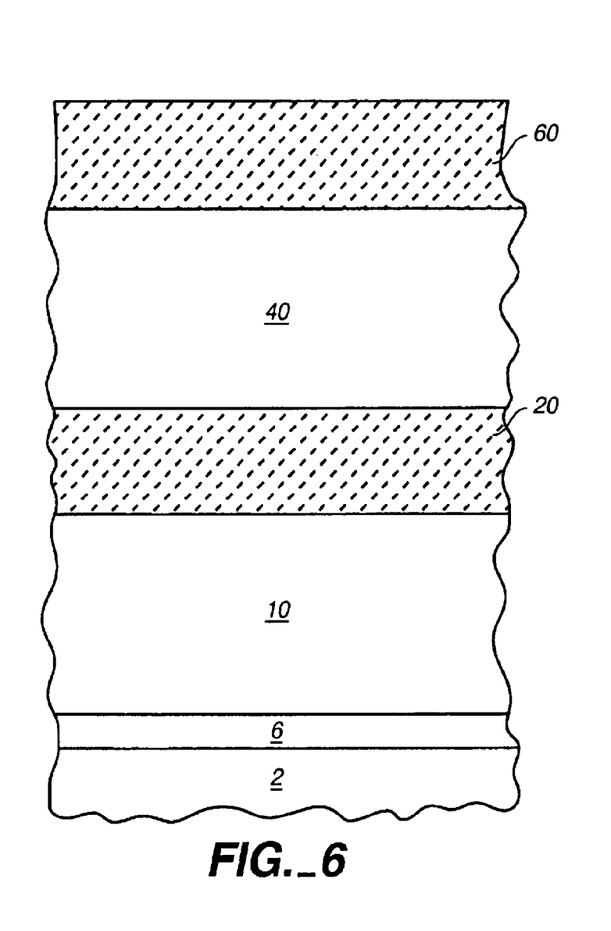
FIG. 6 is a fragmentary vertical cross-sectional view of the structure of FIG. 1, with a second layer of low k dielectric material formed over the first layer of densified dielectric material and a second layer of densified dielectric material formed over the second layer of low k dielectric material.

FIG. 6 shows the structure of FIG. 1 with a second low k dielectric layer 40 thereon, as in the embodiment of FIG. 4, but with a second densified dielectric layer 60 formed by treating the upper surface of second low k dielectric layer 40 to the previously described plasma densification treatment applied to the surface of first low k dielectric layer 10 to form first densified dielectric layer 20.

Figure 7:
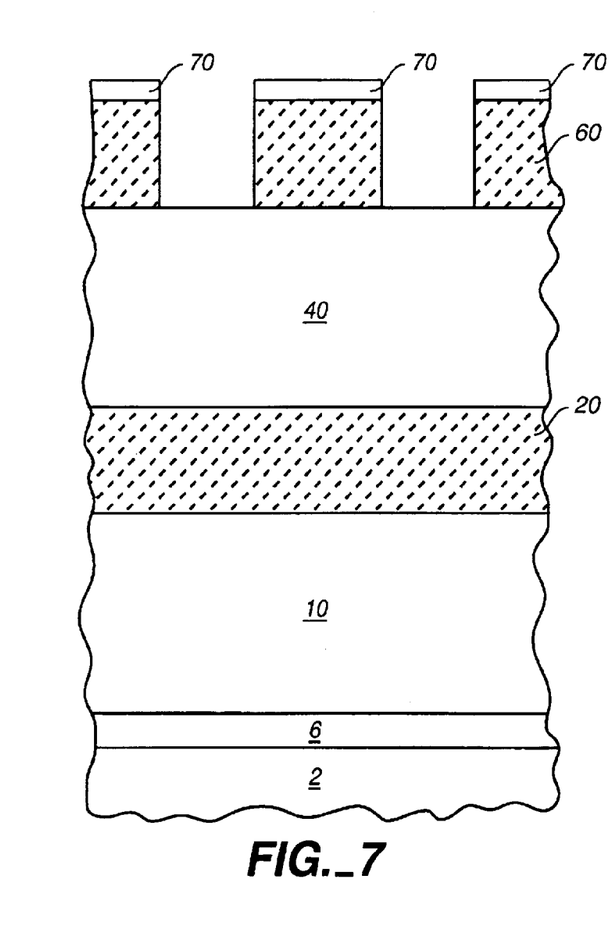
FIG. 7 is a fragmentary vertical cross-sectional view of the structure of FIG. 6, with a photoresist mask formed over the second layer of densified dielectric material, with openings, such as via openings, etched in the second layer of densified dielectric material through the resist mask.
Figure 8:
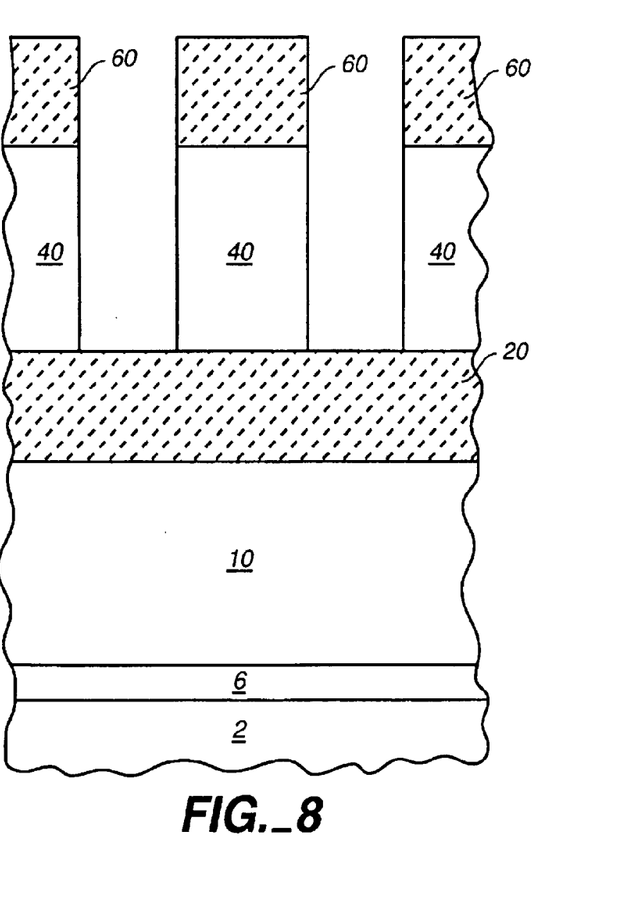
FIG. 8 is a fragmentary vertical cross-sectional view of the structure of FIG. 7, with the photoresist mask removed, and with the via openings etched in the second layer of low k dielectric material through the openings previously etched in the layer of densified dielectric material which now functions as a hard etch mask, and with the first layer of densified dielectric functioning as an etch stop.

A resist mask 70 is then formed over second densified dielectric layer 60 having a via pattern therein. This via pattern in resist mask 70 is then replicated in second densified dielectric layer 60, as also shown in FIG. 7, using a fluorocarbon/hydrofluorocarbon etch. Resist mask 70 may then be removed, leaving the via pattern in second densified layer 60 as a hard mask, as shown in FIG. 8. Preferably, resist mask 70 is removed prior to commencement of the etching of second low k dielectric layer 40 to avoid damage to second low k layer 40 by the etchant system used to remove resist mask 70.

After removal of resist mask 70, second low k dielectric layer 40 is etched through the openings previously etched in second densified layer 60, again using a fluorocarbon etch. This etch is carried out, as shown in FIG. 8, until the etch reaches first densified dielectric layer 20, at which time the chemistry of the etch is changed to a fluorocarbon/hydrofluorocarbon etch to etch through first densified dielectric layer 20. After the etch reaches first low k dielectric layer 10 beneath first densified dielectric layer 20, the etch chemistry is again adjusted to the same etch chemistry used to etch through second low k dielectric layer 40 until barrier layer 6 is reached.

Figure 9:
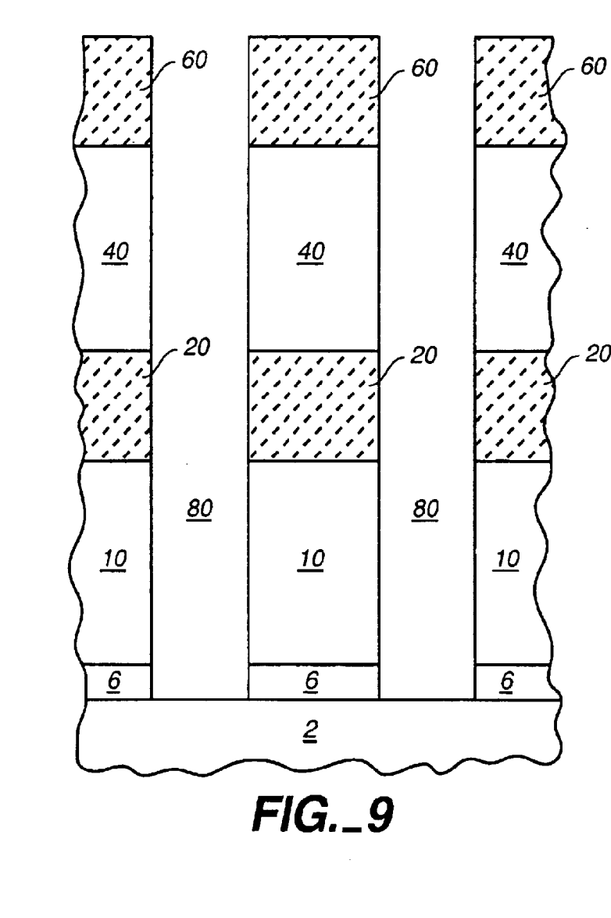
FIG. 9 is a fragmentary vertical cross-sectional view of the structure of FIG. 8, with the via openings also now etched in the first layer of densified k dielectric material and the first layer of low k dielectric material down to the underlying integrated circuit structure.

The etchant system is then again changed to provide conditions favorable to the etching of barrier layer 6. When barrier layer 6 comprises a conventional silicon oxide layer, the fluorocarbon/hydrofluorocarbon etchant system may again be used. Alternatively, when barrier layer 6 comprises a silicon nitride layer, a $CHF_3$ and $NH_3$ etchant system may be used to remove the exposed portions of barrier layer 6. In any case, the removal of the exposed portions of barrier layer 6 completes the formation of via openings 80 down to integrated circuit structure 2, as shown in FIG. 9.

Figure 10:
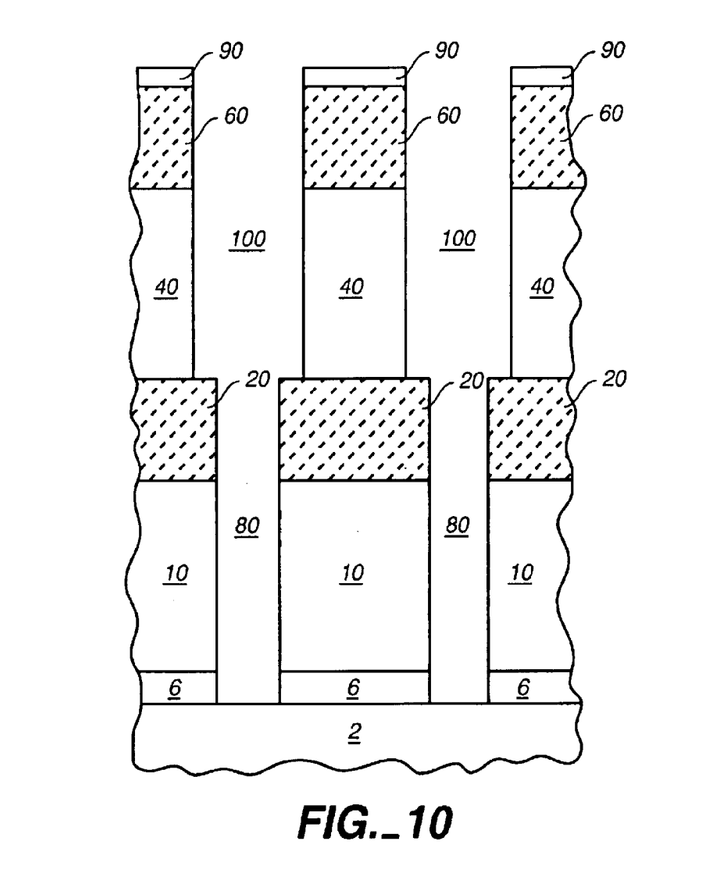
FIG. 10 is a fragmentary vertical cross-sectional view of the structure of FIG. 9, with an etch mask with larger openings, such as trench openings, formed over the remaining portions of the second layer of densified dielectric material, and with such trench openings shown replicated in the second layer of densified dielectric material and the second layer of low k dielectric material, with the trench etch stopping at the first layer of densified dielectric material.

Turning now to FIG. 10, a pattern of trenches 100 in registry with vias 80 is shown formed by formation of a trench mask layer 90 over the remaining portions of second densified dielectric layer 60. A pattern of trenches 100 is then etched in second densified dielectric layer 60 and second low k dielectric layer 40 through trench mask 90, down to first densified layer 20, which functions as an etch stop. As previously described, a fluorocarbon/hydrofluorocarbon etch may be used to etch second densified dielectric layer 60, with the etch chemistry changed, when second low k dielectric layer 40 is reached so that, to a fluorocarbon etch which will be selective to densified dielectric material (will favor the etching of low k dielectric material) when the etch stop (first densified dielectric layer 20) is reached. The result, as shown in FIG. 10, is a double damascene structure with the first and second low k dielectric layers 10 and 40, and the densified dielectric layers 10 and 60 all preferably formed from the same material wherein adhesion problems between layers of differing materials has been effectively eliminated. Furthermore, the densified dielectric material, formed by plasma treatment of the low k dielectric material, is capable of functioning as an etch stop or as a hard mask due to the ability to selectively etch either the low k dielectric material or the densified dielectric material made from the low k dielectric material.

Figure 11:
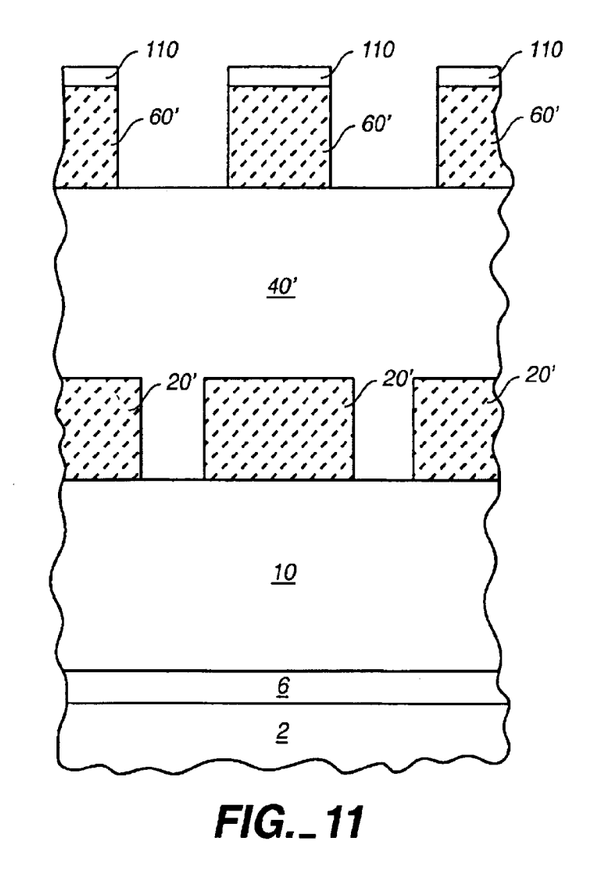
FIG. 11 is a fragmentary vertical cross-sectional view of an alternate embodiment of the invention showing the structure of FIG. 2 having a second layer of low k dielectric material formed over the first patterned layer of densified dielectric material, and a second patterned layer of densified dielectric material formed over the second layer of low k dielectric material.

FIG. 11 illustrates another embodiment wherein first densified dielectric layer 20' is shown already patterned with a via resist mask (not shown) prior to formation of second low k dielectric layer 40' thereon. The via resist mask, after patterning of first densified dielectric layer 20', is then removed, prior to etching of first low k layer 10. This ensures that first low k dielectric layer 10 will not be damaged by the materials used to remove the via etch mask. After formation of second low k dielectric layer 40' over first densified dielectric layer 20' and the via openings therein, a second densified dielectric layer 60' is formed by plasma densification of the upper surface portion of low k dielectric layer 40', as in the previous embodiment.

However, unlike the previous embodiment (wherein via mask 70 is then formed over second densified dielectric layer 60 to first form the via openings), a resist mask 110, with a pattern of trench openings therein, is formed over second densified dielectric layer 60'. The pattern of trench openings in resist mask 110 is then replicated in second densified dielectric layer 60' by selective etching of second densified dielectric layer 60', as shown in FIG. 11, followed by removal of trench resist mask 110. The final step then is a single etching step selective to densified dielectric material. This may be carried out using a previously described fluorocarbon etch.

In this single etching step, both the via openings (in first low k dielectric layer 10 and first densified dielectric layer 20') and the trench openings (in second low k dielectric layer 40') are formed at the same time, with first densified dielectric layer 20' functioning as a via etch mask for formation of the vias in and beneath previously patterned first densified dielectric layer 20', and as an etch stop for the formation of the trenches above first densified dielectric layer 20'.

Thus, in this embodiment, both the via resist mask and the trench resist mask are removed prior to the etching of any of the layers of low k dielectric material and damage to exposed portions of low k dielectric material by the resist mask removal procedures is, therefore, avoided. However, it should be noted that the practice of this embodiment could require (depending upon the selectivity of the etch) the use of a thicker layer for first densified dielectric layer 20', since first densified dielectric layer 20' will function as a via etch mask, unlike the prior embodiment wherein first densified dielectric layer 20 was only required to function as an etch stop layer for the formation of the trenches in the dielectric layers above first densified dielectric layer 20. Such use of a thicker densified dielectric material as a via hard mask may negatively impact on the overall dielectric constant of the composite of dielectric layers.

The following may serve to better illustrate the practice of one embodiment of the invention. Over a previously formed layer of metal interconnects on a silicon substrate may be formed a barrier layer of about 500 Å thickness of silicon carbide. An approximately 400 nanometer (nm) thick layer of low k carbon-containing silicon oxide dielectric material may then be formed over the barrier layer by reacting methyl silane with a source of oxygen. The top surface of the resulting layer of low k dielectric material is then exposed to a hydrogen plasma to form a densified dielectric layer over the low k dielectric layer. The plasma densification treatment is carried out for about 3 minutes at a temperature of about 450° C., a pressure of about 2 Torr, and while maintaining the plasma at a power level of about 1000 watts (at a single frequency of 13.56 MHz) to form an about 50–100 nm thick layer of densified dielectric material over the low k dielectric layer. The steps to form the low k layer and the densified layer are then each repeated to form the desired composite layer of dielectric materials comprising a barrier layer of dielectric material, a first layer of low k dielectric material, a first layer of densified dielectric material, a second layer of low k dielectric material, and a second layer of densified dielectric material.

A resist mask with a pattern of via openings can then be formed over the second layer of densified dielectric material. A fluorocarbon/hydrofluorocarbon etch (using $CF_4$, $CH_2F_2$, argon, and oxygen) is then used at a pressure of from about 100–200 millitorr to remove the exposed portions of the second densified layer, after which the resist mask can be removed, using a conventional ashing process. A fluorocarbon etch (using $CF_4$, Ar, CO, and $N_2$) can then be used to remove the exposed portions of the underlying second layer of low k dielectric material until the first layer of densified material is reached. The etch chemistry is then changed back to a fluorocarbon/hydrofluorocarbon etch until the first densified layer is penetrated down to the underlying first layer of low k dielectric material, at which time the etch chemistry will be again changed back to a fluorocarbon etch until the underlying silicon oxide barrier layer is reached. The etch chemistry will then be changed again back to fluorocarbon/hydrofluorocarbon etch to etch away the exposed silicon oxide barrier layer down to the metal interconnect layer.

A second mask, having a pattern of trench openings therein in registry with the already etched vias, may then be formed over the second layer of densified dielectric material. Trenches may then be etched in both the second densified layer and the second low k layer using the same etch conditions described above for these layers, with the trench etch then stopping at the first layer of densified material. The resultant dual damascene structure, having a pattern of trenches formed in the top two layers and a pattern of vias formed in the lower layers in registry with the trench openings will be found to have good adhesion between the layers and relatively free, therefore, of subsequent delamination problems. Furthermore, damage to the low k dielectric material will be minimized.

Thus, the invention provides a process for forming via and trench openings in multiple layers of dielectric materials, including layers of low k dielectric material, wherein the layer or layers of densified dielectric material formed from the low k dielectric material can then function as etch stop and mask layers for the formation of vias and/or trenches in the layer or layers of low k dielectric material without the need to add permanent layers of other materials such as silicon nitride or silicon carbide to the structure. This results in an overall lowering of the resultant dielectric constant of the compound layers of dielectric material, as well as improving the adhesive characteristics of the resulting composite of dielectric layers, and consequent reduction or elimination of delamination problems without, however, encountering damage to the low k dielectric material during such processing.

Having thus described the invention what is claimed is:

1. A process for forming an integrated circuit structure having at least one layer of low k material therein and a layer, formed from a low k dielectric layer, suitable for use as an etch stop and/or an etch mask which consists essentially of:
    a) forming a first layer of low k dielectric material over previously formed portions of said integrated circuit structure; and
    b) treating the upper surface of said first layer of low k dielectric material with a plasma formed from a reducing gas to form a first layer of densified dielectric material over the remainder of the underlying first layer of low k dielectric material whereby said first layer of densified dielectric material is capable of serving as an etch mask for etching of said underlying first layer of low k dielectric material;
    c) forming a photoresist mask over said first layer of densified dielectric material;
    d) patterning said first layer of densified dielectric material through said photoresist mask to form a first etch mask layer of densified dielectric material having a pattern of openings therein suitable for use in etching a corresponding pattern of openings in said underlying first layer of low k dielectric material;
    e) then removing said photoresist mask before etching any openings in said underlying first layer of low k dielectric material through said pattern of openings in said first etch mask layer of densified dielectric material, whereby said first layer of densified dielectric material serves as an etch mask for subsequent etching of said underlying first layer of low k dielectric material;
    f) then forming a second layer of low k dielectric material over said first etch mask of dielectric material; and
    g) then treating the upper surface of said second layer of low k dielectric material with a plasma formed from a reducing gas to form a second layer of densified dielectric material over the remainder of said second layer of low k dielectric material.

2. The process of claim 1 including the further steps of:
    a) forming a second photoresist mask over said second layer of densified dielectric material;
    b) patterning said second layer of densified dielectric material through said second photoresist mask to form a second etch mask layer of densified dielectric material over said second layer of low k dielectric material, said second etch mask layer having a pattern of openings therein suitable for use in etching a corresponding pattern of openings in the underlying second layer of low k dielectric material;
    c) then removing said second photoresist mask before etching any openings in said underlying second layer of low k dielectric material through said pattern of openings in said second etch mask layer of densified dielectric material;
    d) etching a pattern of openings in said second layer of low k dielectric material through said pattern of openings in said second etch mask layer; and
    e) etching a pattern of openings in said first low k dielectric layer through said first etch mask of dielectric material and said pattern of openings formed in said second layer of low k dielectric material.

3. The process of claim 2 wherein said step of etching a pattern of openings in said second layer of low k dielectric material through said pattern of openings in said second etch mask layer of dielectric material utilizes said first etch mask layer of dielectric material as an etch stop.

4. The process of claim 3 wherein:
    a) said step of etching a pattern of openings in said second layer of low k dielectric material through said pattern of openings in said second etch mask layer further comprises forming trenches in said second layer of low k dielectric material; and
    b) said step of etching a pattern of openings in said first low k dielectric layer through said first etch mask of dielectric material and said pattern of openings formed in said second layer of low k dielectric material further comprises forming vias in said first layer of low k dielectric material in communication with said trenches.

5. The process of claim 1 including the further steps of:
    a) forming a second resist mask over said second layer of densified dielectric material;
    b) patterning said second layer of densified dielectric material through said second photoresist mask to form a second etch mask layer of densified dielectric material over said second layer of low k dielectric material, said second etch mask layer having a pattern of openings therein suitable for use in etching a corresponding pattern of openings in the underlying second layer of low k dielectric material;
c) then removing said second photoresist mask before etching any openings in said underlying second layer of low k dielectric material through said pattern of openings in said second etch mask layer of densified dielectric material;
d) etching a pattern of openings in said second layer of low k dielectric material through said pattern of openings in said second etch mask layer of dielectric material;
e) forming a pattern of openings in said first etch mask layer through said pattern of openings formed in said second layer of low k dielectric material; and
f) etching a pattern of openings in said first layer of low k dielectric material through said pattern of openings in said first etch mask layer.

6. The process of claim 5 including the further steps of:
a) forming a third etch mask over said second etch mask layer, said third etch mask having openings larger than the openings in said pattern of openings in said second etch mask layer; and
b) etching said larger openings through:
i) said second etch mask layer; and
ii) said second layer of low k dielectric material;
down to said first etch mask layer, using said third etch mask;
whereby said structure will have a pattern of smaller openings formed in said first layer of low k dielectric material and a pattern of larger openings formed in said second layer of low k dielectric material and generally in registry with said pattern of smaller openings.

7. The process of claim 5 wherein said openings formed in said first and second layers of low k dielectric material and said first and second etch mask layers comprise vias, and said process includes the further steps of:
a) forming a trench mask over said second etch mask layer, said trench mask having openings larger than said vias in said second etch mask layer; and
b) etching said trenches through:
i) said second etch mask layer; and
ii) said second layer of low k dielectric material;
down to said first etch mask layer which then functions as an etch stop layer;
whereby said structure will have a pattern of vias formed in said first layer of low k dielectric material and a pattern of trenches formed in said second layer of low k dielectric material, with said trenches in registry with said vias.

8. The process of claim 1 including the further steps of:
a) forming a second photoresist mask over said second densified layer of dielectric material;
b) patterning said second layer of densified dielectric material through said second photoresist mask to form, over said second layer of low k dielectric material, a second etch mask layer of densified dielectric material;
c) then removing said second photoresist mask before etching any openings in said underlying second layer of low k dielectric material through said pattern of openings in said second etch mask layer of densified dielectric material; and
d) then etching a pattern of openings in said second layer of low k dielectric material through said pattern of openings in said second etch mask layer, with said first layer of densified dielectric material serving as an etch stop.

9. The process of claim 8, including the further step of etching a pattern of openings in said first layer of low k dielectric material through said openings in said second low k dielectric layer, and through said pattern of openings in said first etch mask layer thereunder.

10. The process of claim 8 including the further steps of:
a) forming a third etch mask over said second etch mask layer, said third mask having openings larger than the openings in said pattern of openings in said second etch mask layer; and
b) etching said larger openings through:
i) said third etch mask layer;
ii) said second etch mask layer of densified dielectric material;
ii) said second layer of low k dielectric material down to said first etch mask layer of densified dielectric material; and
c) then etching openings in said first layer of low k dielectric material through said first etch mask layer of dielectric material;
whereby said structure will have a pattern of smaller openings formed in said first layer of low k dielectric material and a pattern of larger openings formed in said second layer of low k dielectric material and generally in registry with said pattern of smaller openings.

11. The process of claim 1 including the further steps of:
a) forming over said second layer of densified dielectric material a second photoresist mask having openings therein larger than said openings in said first photoresist mask;
d) patterning said second layer of densified dielectric material through said second photoresist mask to form a second etch mask layer of densified dielectric material over said second layer of low k dielectric material;
said second etch mask layer of densified dielectric material having a pattern of openings therein comprising openings larger than said openings in said first etch mask layer of densified dielectric material, said openings in said second etch mask layer in registry with at least some of said openings in said first etch mask layer.

12. The process of claim 11 including the further steps of:
a) removing said second photoresist mask before etching any openings in said underlying second layer of low k dielectric material through said pattern of openings in said second etch mask layer of densified dielectric material;
b) etching a pattern of openings in said second layer of low k dielectric material through said pattern of openings in said second etch mask layer, thereby exposing said pattern of opening in said first etch mask layer; and
c) etching a pattern of openings in said first layer of low k dielectric material through said exposed pattern of openings in said first etch mask layer.

13. A process for forming a structure having a low k material therein which comprises:
a) forming a first layer of dielectric material over an integrated circuit structure;
b) forming a first layer of low k dielectric material over said first layer of dielectric material;
c) treating the upper surface of said first layer of low k dielectric material with a plasma formed from a non-oxidizing gas to form a first layer of densified dielectric material over the remainder of said first layer of low k dielectric material;

d) forming over said first layer of densified material a photoresist via mask having a pattern of via openings therein;

e) etching said first layer of densified material through said photoresist via mask to replicate in said first layer of densified material said pattern of via openings in said photoresist via mask;

f) removing said photoresist via mask before etching any openings in said underlying first layer of low k dielectric material through said pattern of via openings in said first etch mask layer of densified dielectric material, whereby said first layer of densified dielectric material serves as an etch mask for subsequent etching of said underlying first layer of low k dielectric material;

g) forming a second layer of low k dielectric material over said first layer of densified dielectric material;

h) treating the upper surface of said second layer of low k dielectric material with a plasma formed from a non-oxidizing gas to form a second layer of densified dielectric material over the remainder of said second layer of low k dielectric material;

i) forming over said second layer of densified dielectric material a photoresist trench mask having a pattern of trench openings therein in registry with said pattern of via openings in said first layer of densified material;

j) etching said pattern of trench openings in said second layer of densified dielectric material through said photoresist trench mask to replicate in said second layer of densified material said pattern of trenches in said photoresist trench mask;

k) then removing said photoresist trench mask before etching said second layer of low k dielectric material;

l) then etching said second layer of low k dielectric material through said trench openings formed in said second layer of densified dielectric material down to said first layer of densified dielectric material, thereby exposing, at the bottom of said trenches, said pattern of via openings formed in said first layer of densified material; and m) then etching vias in said first layer of dielectric material and said first layer of low k dielectric material dielectric layers down to said integrated circuit structure through said exposed pattern of openings previously formed in said first layer of densified material at the bottom of said trenches.

* * * * *